(12) United States Patent
Tropp

(10) Patent No.: US 8,760,160 B2
(45) Date of Patent: Jun. 24, 2014

(54) SYSTEM FOR TRAVELLING WAVE MR IMAGING AT LOW FREQUENCIES AND METHOD OF MAKING SAME

(75) Inventor: James S. Tropp, Berkeley, CA (US)

(73) Assignee: General Electric Company, Schenectady, NY (US)

(*) Notice: Subject to any disclaimer, the term of this patent is extended or adjusted under 35 U.S.C. 154(b) by 465 days.

(21) Appl. No.: 13/250,202

(22) Filed: Sep. 30, 2011

(65) Prior Publication Data
US 2013/0082710 A1    Apr. 4, 2013

(51) Int. Cl.
*G01V 3/00* (2006.01)
(52) U.S. Cl.
USPC ............................................ 324/307; 324/309
(58) Field of Classification Search
USPC .......................... 324/300–322; 600/409–445
See application file for complete search history.

(56) References Cited

U.S. PATENT DOCUMENTS

| | | | | | |
|---|---|---|---|---|---|
| 3,012,203 | A | * | 12/1961 | Tien | 330/4.6 |
| 6,317,095 | B1 | * | 11/2001 | Teshirogi et al. | 343/785 |
| 7,800,368 | B2 | * | 9/2010 | Vaughan et al. | 324/318 |
| 7,839,145 | B2 | * | 11/2010 | Cornwell | 324/307 |
| 8,013,607 | B2 | * | 9/2011 | DeMeester et al. | 324/318 |
| 8,344,727 | B2 | * | 1/2013 | Cornwell | 324/307 |
| 2011/0115486 | A1 | | 5/2011 | Frohlich et al. | |

OTHER PUBLICATIONS

Brunner et al., "Travelling-wave nuclear magnetic resonance," Nature, vol. 457, Feb. 19, 2009, pp. 994-999.

* cited by examiner

*Primary Examiner* — Brij Shrivastav
(74) *Attorney, Agent, or Firm* — Ziolkowski Patent Solutions Group, SC

(57) ABSTRACT

A system for travelling wave MR imaging includes an MR imaging apparatus having a magnet coil assembly having a magnet coil bore extending therethrough, a gradient coil assembly positioned within the magnet coil bore and having a gradient coil bore extending therethrough, and a waveguide positioned within the gradient coil bore. The waveguide has a waveguide bore extending therethrough. A computer is programmed to access a scan sequence comprising an RF pulse sequence and execute the scan sequence. During execution of the scan sequence, the computer is programmed to operate the waveguide in a hybrid mode to transmit an RF pulse of the RF pulse scan sequence as a travelling wave at a frequency lower than a cutoff frequency of a principal mode of the waveguide absent a dielectric core and to acquire MR signals from an imaging subject positioned within the waveguide bore.

23 Claims, 3 Drawing Sheets

SYSTEM FOR TRAVELLING WAVE MR IMAGING AT LOW FREQUENCIES AND METHOD OF MAKING SAME

BACKGROUND OF THE INVENTION

Embodiments of the invention relate generally to magnetic resonance (MR) imaging and, more particularly, to MR imaging using a waveguide to transmit radio frequency (RF) pulses of an MR scan sequence.

When a substance such as human tissue is subjected to a uniform magnetic field (polarizing field $B_0$), the individual magnetic moments of the spins in the tissue partially align with this polarizing field, to the extent permitted by thermal agitation. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. The transverse moment precesses at the Larmor frequency; and the signal emitted by the excited (precessing) spins after the excitation signal $B_1$ may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

In typical MR systems, as is known in the art, RF coils are used to generate RF signals that generate the excitation signal $B_1$ to tip and excite the spins in the tissue being imaged. These signals are strictly localized in the vicinity of the antenna (or coil) which produces them. In another type of recently introduced MR system that reflects a new paradigm for MR transduction, a hollow, cylindrical tube within the bore of the main magnet may under certain conditions, be used as a waveguide to propagate the excitation RF signals, in the form of travelling waves and indeed to receive the RF emissions from the resulting transverse magnetization. A major benefit of travelling wave MR is the ability to produce RF excitations along the entire length of the human body, using only a single transmitter mounted at an extremity (head or foot) of the subject to be imaged.

In a typical MR system, the geometries of such a cylindrical tube result in a cutoff frequency for the waveguide at or near 300 MHz for its principal mode of operation i.e. the $TE_{11}$ mode, as is known in the art. For an MR system having a main magnetic field strength of 7.0 T (corresponding to a Larmor frequency of 300 MHz for protons), travelling wave MRI near the cutoff 300 MHz is therefore practicable. Travelling wave MR imaging has heretofore been applied such very high Larmor frequencies (e.g., 300 MHz). This value of the cutoff frequency is fortuitously determined by the diameter of the conductive gradient shield, which, as is known in the art, forms a conductive cylinder between the radiofrequency body/volume transmit coil, and the tube on which are mounted the imaging gradients. That is, the cutoff near 300 MHz is a consequence of the shield diameter, which is chosen for reasons not related to selection of a particular frequency.

However, most MR systems designed for use with live imaging subjects have magnetic field strengths less than 7.0 T. For example, many MR systems are designed with magnetic field strengths of 3.0 T or 1.5 T. To use a waveguide in a 3.0 T or 1.5 T MR system in its principal (e.g., transverse electric) mode of operation, the waveguide would have to have a diameter larger than the main magnet bore of a typical MR system.

It would therefore be desirable to have a system for MR imaging using a waveguide in a typical MR system having a magnetic field strength less than 7.0 T.

BRIEF DESCRIPTION OF THE INVENTION

In accordance with one aspect of the invention, an MR imaging apparatus comprises a magnetic resonance imaging (MRI) system including a magnet coil assembly having a magnet coil bore extending therethrough, a gradient coil assembly positioned within the magnet coil bore and having a gradient coil bore extending therethrough, and a waveguide positioned within the gradient coil bore. The waveguide has a waveguide bore extending therethrough. A transmission line is coupled to the waveguide and forms a single conductor waveguide. The MRI system also includes a computer programmed to access a scan sequence comprising an RF pulse sequence and execute the scan sequence. During execution of the scan sequence, the computer is programmed to operate the waveguide in a hybrid mode to transmit an RF pulse of the RF pulse scan sequence as a travelling wave at a frequency lower than a cutoff frequency of a principal mode of the waveguide absent a dielectric core and to acquire MR signals from an imaging subject positioned within the waveguide bore. The computer is also programmed to reconstruct an image based on the acquired MR signals.

In accordance with another aspect of the invention, a method of making an MR imaging system comprises positioning a gradient coil assembly within a bore of a magnet coil assembly, positioning a waveguide within a bore of the gradient coil assembly, and coupling a transmission line to the waveguide to form a single conductor waveguide. The method also comprises configuring a computer to operate the waveguide in a hybrid mode during execution of a scan sequence to transmit an RF pulse as a travelling wave at frequency lower than a cutoff frequency of a principal mode of the waveguide absent a dielectric core and to acquire MR signals from an imaging subject positioned within the waveguide bore during execution of the scan sequence. The computer is further configured to reconstruct an image based on the acquired MR signals.

In accordance with yet another aspect of the invention, a non-transitory computer readable medium having stored thereon a computer program comprising instructions, which, when executed by a computer, cause the computer to execute a scan sequence configured to acquire MR signals from an imaging subject positioned within a bore of a magnet coil assembly, the scan sequence comprising an RF pulse sequence. During execution of the scan sequence, the instructions cause the computer to control a single conductor waveguide positioned within the bore of a magnet coil assembly to transmit an RF pulse of the RF pulse scan sequence in a hybrid mode as a travelling wave at frequency lower than a cutoff frequency of a principal mode of the waveguide absent a dielectric core and to acquire MR signals from the imaging subject. The instructions further cause the computer to reconstruct an image based on the acquired MR signals.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Embodiments of the invention are directed to MR imaging using a waveguide having a partial filling of dielectric (i.e., a dielectric core or slug) therein. In particular, the dielectric filling may be provided by placement of the subject to be imaged inside the waveguide positioned in the magnet bore.

Figure 1:
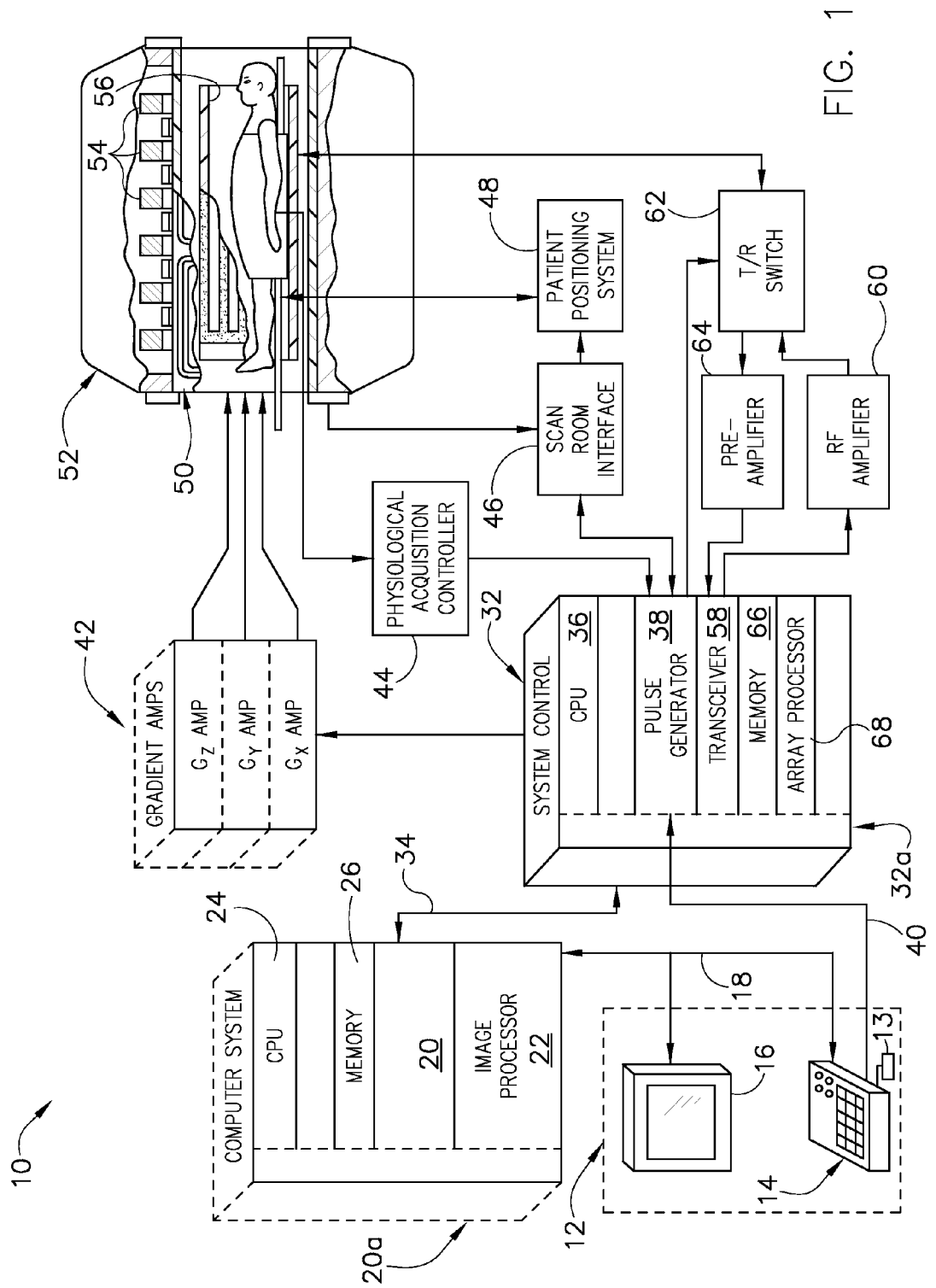
FIG. 1 is a schematic block diagram of an exemplary MR imaging system incorporating an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

Figure 2:
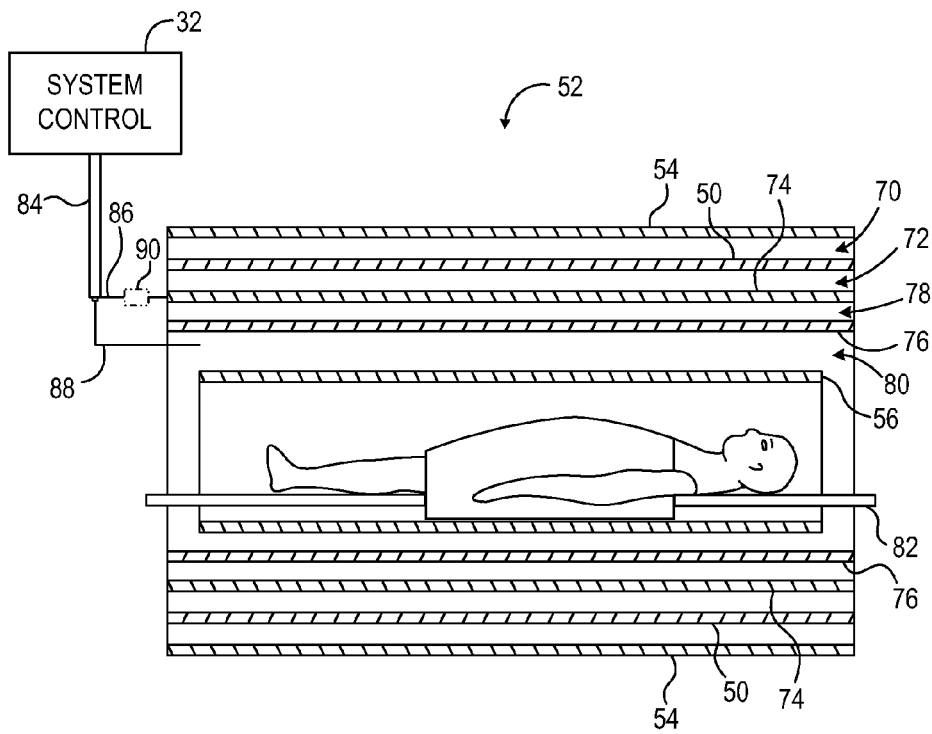
FIG. 2 is a schematic block diagram of the resonance assembly of the MR imaging system of FIG. 1 according to an embodiment of the invention.

FIG. 2 illustrates a schematic block diagram of resonance assembly 52 of MR imaging system 10 according to an embodiment of the invention. Polarizing magnet 54, which may be formed of a plurality of electromagnetic coils as illustrated in FIG. 1, is designed to generate the uniform magnetic field (polarizing field $B_0$) about which the individual magnetic moments of the spins in the tissue of the imaging object precess in random order at their characteristic Larmor frequency. According to embodiments of the invention, the uniform magnetic field is designed to have a field strength of 3.0 T or 1.5 T, and the characteristic Larmor frequencies correspond approximately with 128 MHz and 64 MHz, respectively.

Polarizing magnet 54 has a bore or opening 70 therethrough into which gradient coil assembly 50 is positioned. Gradient coil assembly 50 has a bore or opening 72 therethrough into which a gradient shield 74 may be positioned. Gradient shield 74 serves to reduce or eliminate a coupling of RF pulses generated by RF local receiver coil 56 or by another component with the gradient coils of gradient coil assembly 50. A patient bore wall 76 is positioned inside a bore or opening 78 of gradient shield 74 and defines an opening or patient bore 80 into which a table 82 of patient positioning system 48 moves to position the patient or imaging object to the desired position for the scan.

As shown in FIG. 2, a transmission line 84 is coupled between system control 32 and gradient shield 74. More specifically, a first conductor 86 of transmission line 84 is coupled to gradient shield 74, and a second conductor 88 of transmission line 84 extends into patient bore 80 of patient bore wall 76. In one embodiment, transmission line 84 comprises a coax cable where first conductor 86 corresponds with the braided shield of the coax cable and where second conductor 88 corresponds with the center signal line of the coax cable. As illustrated, first conductor 86 is directly coupled to gradient shield 74. Such a direct coupling is possible when the impedance of transmission line 84 matches the impedance of gradient shield 74. In another embodiment, an impedance matching network 90 of passive reactive electronic components such as, for example, inductors or capacitors may be used when the impedances are mismatched. That is, impedance matching network 90 is designed to match the impedance of transmission line 84 when it does not match the impedance of gradient shield 74.

Two types of Hertzian dipoles are commonly understood in the art, as sources of electromagnetic fields: electric dipoles, which typically comprise a short linear element of alternating electric current and magnetic dipoles, which comprise a small planar loop of current. It is straightforwardly shown that the magnetic field of a electric dipole is perpendicular (or transverse) to the direction of current flow, whereas the electric field of a magnetic dipole is transverse to the axis of the loop, which is defined as perpendicular to the plane containing the loop, and passing through its center. Therefore, the fields of an electric dipole are called "transverse magnetic" or TM, and those of a magnetic dipole "transverse electric," or TE. In practice, most NMR antennas are loops, so that TE fields are generally more prevalent than TM in NMR.

Mathematically, these two types of fields may be derived by applying the vector differential operation of "curl" to a suitable vectorial potential functions. That is, an electric dipole has a magnetic vector potential directed along the dipole axis, whose curl gives the magnetic field. Conversely, a magnetic dipole has an electric vector potential (also directed along the dipole axis) whose curl gives the electric field. It should be noted that each type of dipole produces both electric and magnetic fields, although the "signature field" of the electric dipole is transverse magnetic, while that of the magnetic dipole is transverse electric. The other fields may be derived by further application of vector differential operations, according to Maxwell's equations.

The designations TE and TM are also useful in describing and classifying the electromagnetic wave fields that can propagate inside hollow conductive pipes (i.e., waveguides). This is not because the fields need be sourced by electric or magnetic dipoles, but rather because the allowed forms of propagating waves are derivable from magnetic and electric vector potentials analogous to those which pertain to the dipoles themselves. It is noted that the terms "electric" and "magnetic" may occur in seemingly perverse reversals of apparent sense (e.g., with an electric dipole giving rise to a magnetic vector potential, which gives rise in turn to a transverse magnetic field). In addition, the terminology in the art also allows for the introduction of a pair of designations: "E waves" (referring to transverse magnetic waves) and "H waves" (referring to transverse electric waves).

In general, the notation for the waveguide mode refer to the type of dipole (e.g., TE or TM) followed by a notation indicating the vector potential of the mode expressed in cylindrical coordinates (i.e., azimuth and radius). The potential function is characterized, in general, by the number of nodes (or zero crossings) traversed by each coordinate in tracing its full excursion. For example, for a TE mode of operation, the notation may be expressed as the $TE_{nm}$ mode, where n corresponds with the number of nodes in the azimuth and where m corresponds with that in the radius. The principle mode (i.e., having the lowest cutoff frequency) for a circular, cylindrical hollow tube, such as gradient shield 74, as a waveguide is the $TE_{11}$ mode, for example.

In addition to its nodes, each waveguide mode is characterized by a cutoff frequency below which wave propagation cannot occur. The lowest cutoff frequency (i.e., of the principal mode) is determined by geometric considerations and corresponds roughly to the frequency whose wavelength equals the diameter of the tube. For a typical MR system, the size of gradient shield 74 within the main magnet bore may yield a cutoff frequency near 300 MHz for the $TE_{11}$. For executing imaging scans in a 3.0 T or 1.5 T MR system, a cutoff frequency near 300 MHz does not obviously allow gradient shield 74 to be used as a waveguide for propagating RF pulses near 128 MHz or 64 MHz, respectively, in the TE or TM modes.

According to an embodiment of the invention, with the presence of a patient or other imaging object to be imaged in patient bore 80, the waveguide becomes a hollow tube loaded with a dielectric slug. By virtue of the presence of the dielectric load presented by the patient or imaging object, system control 32 is configured to control gradient shield 74 as a single conductor waveguide in a hybrid waveguide mode. System control 32 controls second conductor 88 as a drive probe to drive gradient shield 74 according to the RF pulses of a pulse sequence train designed to excite and acquire MR signals from an imaging subject. In this manner, gradient shield 74 is controlled and used as a waveguide that allows for low frequency, travelling wave NMR, for example. As used herein, low frequency refers to frequencies below one half of the cutoff frequency of the principal mode of the empty waveguide.

As used herein, the hybrid mode or hybrid waveguide mode corresponds with a large class of electromagnetic modes whose components correspond not exclusively to a pure TE or TM modes (i.e., H or E modes), but are instead given by linear combinations of components comprising both H and E modes. For example, the hybrid mode is defined herein as an $HE_{nm}$ or $EH_{nm}$ mode comprising a linear combination of both of the TE and TM modes. Hybrid modes typically appear as solutions of Maxwell's equations for waveguides comprising a hollow tube partially filled with dielectric. They are not solutions of Maxwell's equations for empty hollow tubes, which are given instead by TE and TM modes. In one embodiment, system control 32 is configured to control gradient shield 74 in the $HE_{11}$ mode, which has a low cutoff frequency. In general, the hybrid mode is enabled by the presence of a dielectric slug which partly fills the otherwise hollow waveguide tube.

According to the embodiment shown in FIG. 2, while gradient shield 74 is used as a waveguide to transmit the RF pulses of a pulse sequence train, RF coil 56 is controlled to pick up MR signals from the imaging object as described above with respect to FIG. 1. However, as described below with respect to FIG. 3, the detection of MR signals from the imaging object using RF coil 56 is optional.

Figure 3:
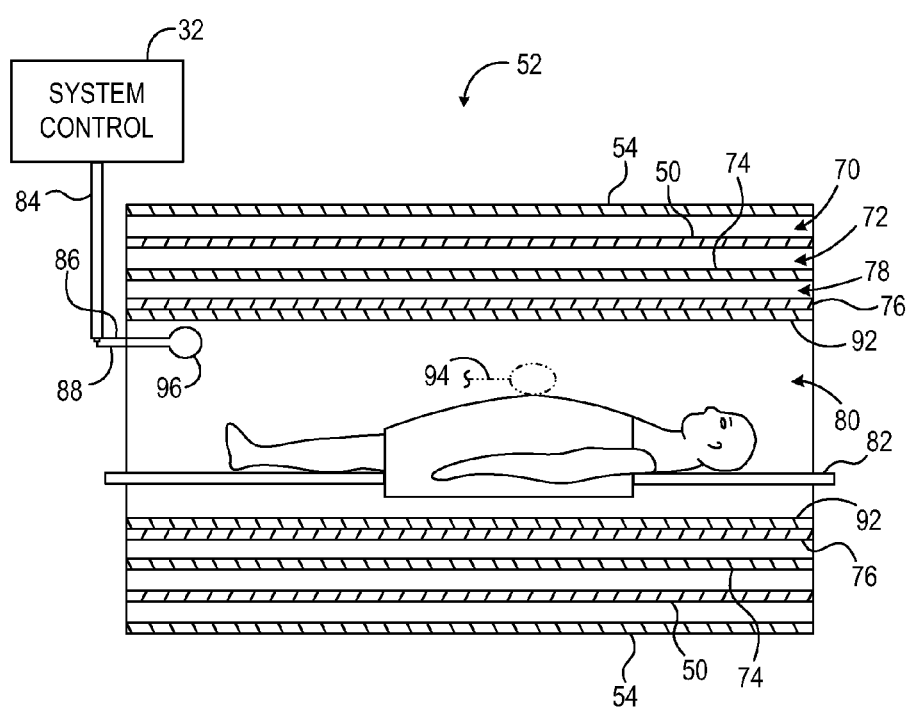
FIG. 3 is a schematic block diagram of the resonance assembly of the MR imaging system of FIG. 1 according to another embodiment of the invention.

Referring now to FIG. 3, a schematic block diagram of resonance assembly 52 of MR imaging system 10 is illustrated according to another embodiment of the invention. As shown, resonance assembly 52 includes gradient coil assembly 50 positioned within bore 70 of polarizing magnet 54. Gradient shield 74 is positioned within bore 72 of gradient coil assembly 50, and patient bore wall 76 is positioned within bore 78 of gradient shield 74.

In addition, patient bore wall 76 is lined with a thin, metal film or foil 92. While metal foil 92 is shown attached to one side of patient bore wall 76, it is contemplated that metal foil 92 may be attached to the opposite side of patient bore wall 76.

As in the embodiment discussed with respect to FIG. 2, system control 32 is configured to control metal foil 92 as a single conductor waveguide in the hybrid waveguide mode as described herein. That is, system control 32 is configured to control metal foil 92 in the hybrid mode to transmit the RF pulses of a pulse sequence train at a frequency corresponding with the characteristic Larmor frequency of the individual magnetic moments of the spins in the tissue of the imaging object. In addition, it is noted that RF coil 56 is not shown in FIG. 3. Instead, metal foil 92 is used for both transmission and reception of RF signals for the scan sequence in one embodiment. It is also contemplated, however, that surface RF local receiver coils (such as coil 94 shown in phantom) as known in the art may be used to receive the RF signals emitted by the imaging object.

To control or drive metal foil 92 to transmit RF signals, first and second conductors 86, 88 of transmission line 84 are coupled to a waveguide drive probe 96. In one embodiment, drive probe 96 is an inductive loop configured to inductively couple to the waveguide. In addition, drive probe 96 may be tuned via capacitors (not shown) to the Larmor frequency of the system or to another frequency useful for imaging. The use of drive probe 96 allows for a non-direct coupling of transmission line 84 to the waveguide, unlike the direct coupling of transmission line 84 to the waveguide as illustrated in FIG. 2.

Figure 4:
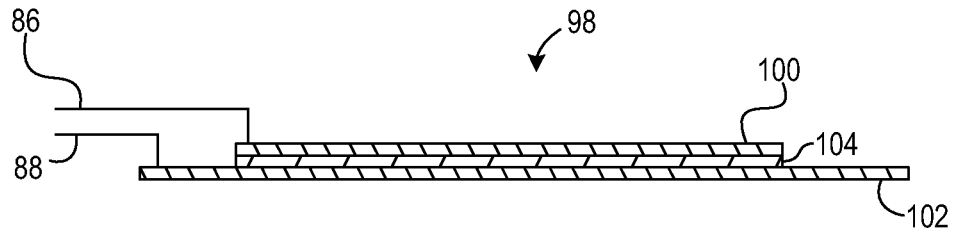
FIG. 4 is a schematic block diagram of a waveguide drive probe according to another embodiment of the invention.

FIG. 4 is a schematic block diagram of a waveguide drive probe or patch antenna 98 according to another embodiment of the invention. Drive probe 98 includes a first conductive layer 100 coupled to first conductor 86. A second conductive layer 102 coupled to second conductor 88 is separated from first conductive layer 100 via a dielectric layer 104. In one embodiment, first and second conductive layers 100, 102 are formed of copper. However, other conductive substances are also contemplated. Drive probe 98 is configured to couple capacitively to the waveguide for driving the waveguide. Similar to drive probe 96, drive probe 98 allows for a non-direct coupling of transmission line 84 to the waveguide.

Figure 5:
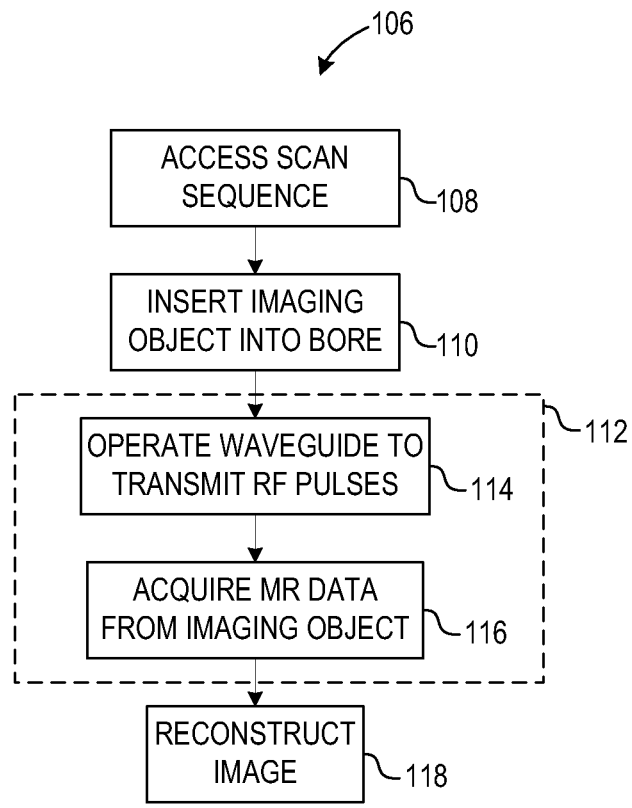
FIG. 5 is a flowchart illustrating an MR imaging technique according to an embodiment of the invention.

FIG. 5 illustrates a flowchart of an MR imaging technique 106 according to an embodiment of the invention. Technique 106 begins at block 108 with accessing a scan sequence including an RF pulse sequence having one or more RF pulses. The scan sequence also includes a gradient pulse sequence having one or more gradient pulses. At block 110, a patient or other imaging object is positioned within the patient imaging bore of the MR system. The patient imaging bore is within the bore of the waveguide. It is recognized that block 110 may instead be performed prior to block 108.

Technique 106 continues with execution of the scan sequence as indicated generally by reference numeral 112. During execution of the scan sequence, a single conductor waveguide is operated at block 114 according to a hybrid mode as described herein to transmit the one or more RF pulses of the RF pulse scan sequence in order to excite spins in the imaging object. According to embodiments of the invention, the frequency of the transmitted RF pulses is lower than the cutoff frequency of the principal mode of the waveguide. For example, the frequency of the transmitted RF pulses for a 3.0 T MR system are approximately equal to 128 MHz, while the frequency of the transmitted RF pulses for a 1.5 T MR system are approximately equal to 64 MHz as described herein. Both of these frequencies are lower than a cutoff frequency of approximately 300 MHz when the waveguide is used in its principal mode such as $TE_{11}$, for example. According to one embodiment, the gradient shield of the MR system is used as the waveguide. In another embodiment, a different metal shield or foil is used as the waveguide. In this embodiment, the metal shield may be positioned on either side of a patient bore wall within a bore of the main magnet of the MR system.

At block 116, MR signals are acquired from the imaging object positioned within the waveguide bore. In one embodiment, the MR signals are acquired using an RF coil such as a whole-body RF coil. In another embodiment, the MR signals are acquired using the waveguide as the RF coil. At block 118, technique 106 reconstructs an image based on the acquired MR signals.

One skilled in the art will appreciate that embodiments of technique 104 may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

A technical contribution for the disclosed method and apparatus is that it provides for computer implemented MR imaging using a waveguide to transmit RF pulses of an MR scan sequence.

In accordance with one embodiment of the invention, an MR imaging apparatus comprises a magnetic resonance imaging (MRI) system including a magnet coil assembly having a magnet coil bore extending therethrough, a gradient coil assembly positioned within the magnet coil bore and having a gradient coil bore extending therethrough, and a waveguide positioned within the gradient coil bore. The waveguide has a waveguide bore extending therethrough. A transmission line is coupled to the waveguide and forms a single conductor waveguide. The MRI system also includes a computer programmed to access a scan sequence comprising an RF pulse sequence and execute the scan sequence. During execution of the scan sequence, the computer is programmed to operate the waveguide in a hybrid mode to transmit an RF pulse of the RF pulse scan sequence as a travelling wave at a frequency lower than a cutoff frequency of a principal mode of the waveguide absent a dielectric core and to acquire MR signals from an imaging subject positioned within the waveguide bore. The computer is also programmed to reconstruct an image based on the acquired MR signals.

In accordance with another embodiment of the invention, a method of making an MR imaging system comprises positioning a gradient coil assembly within a bore of a magnet coil assembly, positioning a waveguide within a bore of the gradient coil assembly, and coupling a transmission line to the waveguide to form a single conductor waveguide. The method also comprises configuring a computer to operate the waveguide in a hybrid mode during execution of a scan sequence to transmit an RF pulse as a travelling wave at frequency lower than a cutoff frequency of a principal mode of the waveguide absent a dielectric core and to acquire MR signals from an imaging subject positioned within the waveguide bore during execution of the scan sequence. The computer is further configured to reconstruct an image based on the acquired MR signals.

In accordance with yet another embodiment of the invention, a non-transitory computer readable medium having stored thereon a computer program comprising instructions, which, when executed by a computer, cause the computer to execute a scan sequence configured to acquire MR signals from an imaging subject positioned within a bore of a magnet coil assembly, the scan sequence comprising an RF pulse sequence. During execution of the scan sequence, the instructions cause the computer to control a single conductor waveguide positioned within the bore of a magnet coil assembly to transmit an RF pulse of the RF pulse scan sequence in a hybrid mode as a travelling wave at frequency lower than a cutoff frequency of a principal mode of the waveguide absent a dielectric core and to acquire MR signals from the imaging subject. The instructions further cause the computer to reconstruct an image based on the acquired MR signals.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
   a magnetic resonance imaging (MRI) system having:
      a magnet coil assembly having a magnet coil bore extending therethrough;
      a gradient coil assembly positioned within the magnet coil bore and having a gradient coil bore extending therethrough;
      a waveguide positioned within the gradient coil bore, the waveguide having a waveguide bore extending therethrough;
      a transmission line coupled to the waveguide, the waveguide forming a single conductor waveguide; and
      a computer programmed to:
         access a scan sequence comprising an RF pulse sequence;
         execute the scan sequence;
         during execution of the scan sequence:
            operate the waveguide in a hybrid mode to transmit an RF pulse of the RF pulse scan sequence as a travelling wave at a frequency lower than a cutoff frequency of a principal mode of the waveguide absent a dielectric core; and
            acquire MR signals from an imaging subject positioned within the waveguide bore; and
         reconstruct an image based on the acquired MR signals.

2. The MRI apparatus of claim 1 wherein the transmission line comprises:
   a shield coupled to the waveguide, the shield and the waveguide forming a single conductor; and
   a center conductor extending into the waveguide bore forming a waveguide drive probe.

3. The MRI apparatus of claim 1 wherein the waveguide comprises a gradient shield.

4. The MRI apparatus of claim 1 further comprising an RF local receiver coil assembly positioned within the waveguide bore; and
   wherein the computer is programmed to acquire the MR signals via the RF local receiver coil assembly.

5. The MRI apparatus of claim 4 wherein the RF local receiver coil assembly comprises a whole-body RF receive coil.

6. The MRI apparatus of claim 1 wherein the computer is programmed to acquire the MR signals via the waveguide.

7. The MRI apparatus of claim 1 wherein the computer, in being programmed to operate the waveguide in the hybrid mode, is programmed to operate the waveguide in an $HE_{11}$ mode.

8. The MRI apparatus of claim 1 wherein the computer, in being programmed to operate the waveguide in the hybrid mode, is programmed to operate the waveguide in the hybrid mode to transmit the RF pulse of the RF pulse scan sequence at frequency substantially equal to a Larmor frequency of the MRI apparatus.

9. The MRI apparatus of claim 1 wherein the waveguide comprises a cylindrical body.

10. The MRI apparatus of claim 1 wherein the principal mode of the waveguide corresponds with a transverse electric mode.

11. The MRI apparatus of claim 1 further comprising a drive probe loop coupled to the transmission line; and
    wherein the transmission line is inductively coupled to the waveguide via the drive probe loop.

12. The MRI apparatus of claim 1 further comprising a patch antenna coupled to the transmission line; and
    wherein the transmission line is capacitively coupled to the waveguide via the patch antenna.

13. The MRI apparatus of claim 1 further comprising a dielectric core positioned within the bore.

14. A method of making an MR imaging system comprising:
    positioning a gradient coil assembly within a bore of a magnet coil assembly;
    positioning a waveguide within a bore of the gradient coil assembly;
    coupling a transmission line to the waveguide to form a single conductor waveguide; and
    configuring a computer to:
       operate the waveguide in a hybrid mode during execution of a scan sequence to transmit an RF pulse as a travelling wave at frequency lower than a cutoff frequency of a principal mode of the waveguide absent a dielectric core; and acquire MR signals from an imaging subject positioned within the waveguide bore during execution of the scan sequence; and reconstruct an image based on the acquired MR signals.

15. The method of claim 14 wherein positioning the waveguide comprises positioning a gradient shield within the bore of the gradient coil assembly.

16. The method of claim 15 further comprising positioning an RF coil assembly within a bore of the waveguide.

17. The method of claim 14 wherein configuring the computer to operate the waveguide in the hybrid mode comprises configuring the computer to operate the waveguide in an $HE_{11}$ mode.

18. The method of claim 14 wherein the principal mode of the waveguide corresponds with a non-hybrid mode.

19. The method of claim 14 wherein a cutoff frequency of the hybrid mode is zero.

20. The method of claim 14 wherein coupling the transmission line to the waveguide comprises coupling the transmission line to the waveguide via an impedance matching network.

21. A non-transitory computer readable medium having stored thereon a computer program comprising instructions, which, when executed by a computer, cause the computer to:

execute a scan sequence configured to acquire MR signals from an imaging subject positioned within a bore of a magnet coil assembly, the scan sequence comprising an RF pulse sequence;

during execution of the scan sequence:
control a single conductor waveguide positioned within the bore of a magnet coil assembly to transmit an RF pulse of the RF pulse scan sequence in a hybrid mode as a travelling wave at frequency lower than a cutoff frequency of a principal mode of the waveguide absent a dielectric core; and acquire MR signals from the imaging subject; and
reconstruct an image based on the acquired MR signals.

22. The computer readable medium of claim 21 wherein the instructions that cause the computer to control the waveguide to transmit the RF pulse cause the computer to control a gradient shield to transmit the RF pulse.

23. The computer readable medium of claim 22 wherein the instructions that cause the computer to acquire the MR signals cause the computer to acquire the MR signals via the gradient shield.

\* \* \* \* \*